United States Patent
Kim

(10) Patent No.: US 7,820,537 B1
(45) Date of Patent: Oct. 26, 2010

(54) METHOD FOR FABRICATING SEMICONDUCTOR DEVICE

(75) Inventor: Tae-Han Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/616,911

(22) Filed: Nov. 12, 2009

(30) Foreign Application Priority Data

Jul. 3, 2009 (KR) .................. 10-2009-0060848
Oct. 30, 2009 (KR) .................. 10-2009-0104681

(51) Int. Cl.
*H01L 21/20* (2006.01)
*H01L 21/4763* (2006.01)
*H01L 21/44* (2006.01)
*H01L 21/461* (2006.01)

(52) U.S. Cl. .................. 438/588; 438/584; 438/586; 438/614; 438/622; 438/672; 257/E21.29; 257/E21.577; 257/E21.582

(58) Field of Classification Search ............ 257/E21.29, 257/E21.577, E21.582
See application file for complete search history.

(56) References Cited

U.S. PATENT DOCUMENTS

| 2004/0063286 A1* | 4/2004 | Kim et al. ............ 438/283 |
| 2006/0234447 A1* | 10/2006 | Choi et al. ........... 438/257 |
| 2008/0164511 A1* | 7/2008 | Kim ..................... 257/321 |
| 2008/0169496 A1* | 7/2008 | Keller et al. .......... 257/314 |

* cited by examiner

Primary Examiner—Charles D Garber
Assistant Examiner—Mohsen Ahmadi
(74) Attorney, Agent, or Firm—IP & T Group LLP

(57) ABSTRACT

A method for fabricating a semiconductor device includes forming a polysilicon layer, a barrier metal layer, and a conductive layer over a substrate, forming gate hard masks over the conductive layer, etching the conductive layer and the barrier metal layer using the gate hard masks to form barrier metal electrodes and metal gate electrodes having a line width smaller than that of the gate hard masks, etching the polysilicon layer to form gate patterns, each gate pattern including a stack structure of a polysilicon electrode, the barrier metal electrode, the metal gate electrode, and the gate hard mask, forming a gate spacer over the surface profile of the substrate structure, forming an insulation layer over the gate spacer, etching the insulation layer to form a contact hole between the gate patterns and burying a conductive material over the contact hole to form a landing plug contact.

15 Claims, 6 Drawing Sheets

METHOD FOR FABRICATING SEMICONDUCTOR DEVICE

CROSS-REFERENCE(S) TO RELATED APPLICATIONS

The present application claims priority of Korean Patent Application No(s). 10-2009-0060848 and 10-2009-0104681, filed on Jul. 3, 2009, and Oct. 30, 2009, respectively, which are incorporated herein by reference in their entirety.

BACKGROUND OF THE INVENTION

The disclosed embodiments relate to a method for fabricating a semiconductor device, and more particularly, to a method for fabricating gate patterns and a landing plug contact in a semiconductor device.

Metal gate electrodes are generally applied to reduce resistance of gate electrodes. When a metal gate electrode is applied, a number of metal compound layers are formed to reduce resistance between a metal electrode and a polysilicon electrode, thereby forming a metal gate. Forming the metal gate having multiple layers often results in a slope profile due to the differences between etch rates and characteristics of thin layer materials.

FIGS. 1A and 1B illustrate micrographic views showing gates with a slope profile and distribution of the same.

Referring to FIG. 1A, the slope profile of metal gate electrodes is shown. Referring to FIG. 1B, the slope profile is more likely to be generated in edge regions of a wafer.

The slope profile generally increases a line width of a gate, and therefore causes a sidewall passivation layer for protecting sidewalls of the gate to be damaged while performing a self-aligned contact etch process for forming a subsequent landing plug contact. Consequently, a portion of a metal gate electrode may be exposed. The self-aligned contact etch process includes forming a contact by performing an anisotropic etching process using an etch selectivity between an oxide-based layer and a nitride-based layer without performing a mask process. The self-aligned contact etch process may result in a greater etched portion and loss when a slope profile is generated in a gate than a vertical profile because an etch region is not defined by a mask.

Furthermore, the metal gate electrode exposed by the damaged sidewall passivation layer may cause a bridge between the subsequent landing plug contact and the metal gate electrode. As a result, a self-aligned contact failure may occur.

SUMMARY OF THE INVENTION

Some embodiments are directed to providing a method for fabricating a semiconductor device, which can improve a slope profile of a gate pattern.

Some embodiments are directed to providing a method for fabricating a semiconductor device, which can reduce sidewall passivation layer loss in a gate pattern.

Some embodiments are directed to providing a method for fabricating a semiconductor device, which can decrease an instance of a self-aligned contact failure by preventing a bridge from occurring between a gate pattern and a landing plug contact.

Some embodiments are directed to provide a method for fabricating a semiconductor device, the method comprising forming a polysilicon layer, a barrier metal layer, and a conductive layer over a substrate, wherein the conductive layer is formed for forming electrodes, forming gate hard masks over the conductive layer, etching the conductive layer and the barrier metal layer using the gate hard masks to form barrier metal electrodes and metal gate electrodes having a line width smaller than that of the gate hard masks, etching the polysilicon layer to form gate patterns, each gate pattern including a stack structure of a polysilicon electrode, the barrier metal electrode, the metal gate electrode, and the gate hard mask, forming a gate spacer over the surface profile of the substrate structure, forming an insulation layer over the gate spacer, buried between the gate patterns, etching the insulation layer to form a contact hole between the gate patterns and burying a conductive material over the contact hole to form a landing plug contact.

The conductive layer may comprise a tungsten layer and the barrier metal layer may comprise a stack structure of a titanium layer, a tungsten nitride layer, and a tungsten silicide layer.

The etching of the conductive layer and the barrier metal layer to form the barrier metal electrodes and the metal gate electrodes may comprise performing a main etching process and performing the main etching process using an isotropic etch process.

The isotropic etch process may comprise performing a plasma etch in a magnetically enhanced reactive ion beam etching (MERIE) apparatus.

The isotropic etch process may comprise maintaining a magnetic field flux of approximately 0 G while forming plasma.

The isotropic etch process may comprise maintaining a temperature of a bottom electrode at approximately 90° C., applying a bias power at approximately 40 W, applying a micro wave power at approximately 800 W and maintaining a pressure at approximately 4 mTorr.

The isotropic etch process may comprise using a gas including nitrogen trifluoride ($NF_3$), chlorine ($Cl_2$), Oxygen ($O_2$), nitrogen ($N_2$) and helium (He).

The etching of the polysilicon layer may be performed using an anisotropic etch process.

The anisotropic etching process may comprise using a gas including nitrogen trifluoride ($NF_3$), sulfur hexafluoride ($SF_6$), chlorine ($Cl_2$), nitrogen ($N_2$) and helium (He).

The method may further comprise a perfoming trimming after etching the polysilicon.

The trimming may be performed using a gas including $Cl_2$, $N_2$ and He.

The gate spacer may comprise a nitride-based layer.

The insulation layer may comprise an oxide-based layer.

The etching of the insulation layer to form the contact hole may comprise performing a self-aligned contact etch process.

DESCRIPTION OF SPECIFIC EMBODIMENTS

Figure 1A:
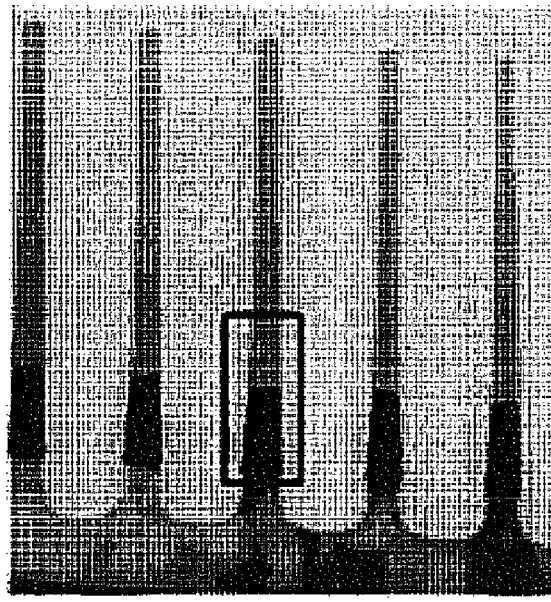
FIGS. 1A and 1B illustrate micrographic views showing gates with a slope profile and distribution of the same.
Figure 1B:
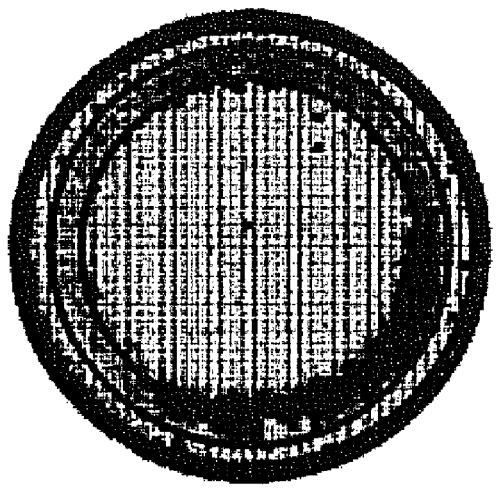

Other objects and advantages of the present invention can be understood by the following description, and become apparent with reference to the embodiments of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

FIGS. 2A to 2H illustrate cross-sectional views of a method for fabricating a semiconductor device in accordance with an embodiment of the present invention.

Figure 2A:
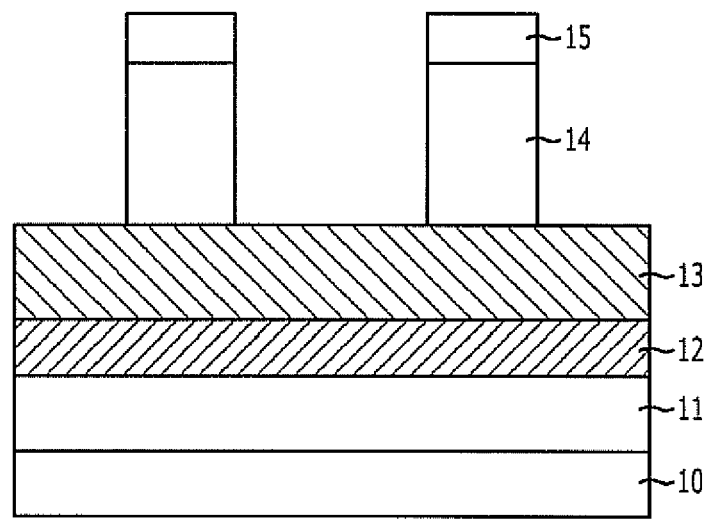
FIGS. 2A to 2H illustrate cross-sectional views of a method for fabricating a semiconductor device in accordance with an embodiment of the present invention.

Referring to FIG. 2A, a polysilicon layer 11 is formed over a substrate 10. The substrate 10 is a semi-finished substrate including a device isolation structure and a well. Although not shown, a gate insulation layer is formed over the substrate 10 before forming the polysilicon layer 11. The polysilicon layer 11 is formed for forming gate electrodes. The polysilicon layer 11 may include doped polysilicon. In detail, the doped polysilicon is formed by implanting N-type impurities into the polysilicon layer 11 to form an n-channel metal-oxide-semiconductor (NMOS) and implanting P-type impurities into the polysilicon layer 11 to form a p-channel metal-oxide-semiconductor (PMOS). For instance, the N-type impurities may include one of phosphorus (P) and arsenic (As), and the P-type impurities may include boron (B).

A barrier metal layer 12 and a metal layer 13 for forming electrodes are formed over the polysilicon layer 11. The barrier metal layer 12 is formed to reduce interfacial resistance between the metal layer 13 and the polysilicon layer 11 and to prevent diffusion of the metal layer 13. For example, the barrier metal layer 12 may include a stack structure of a titanium (Ti) layer, a tungsten nitride (WN) layer, and a tungsten suicide (WSi) layer formed over the polysilicon layer 11. The metal layer 13 is formed to reduce resistance of gate patterns. The metal layer 13 includes a metal having a low resistivity. For instance, the metal layer 13 may include a tungsten (W) layer.

Gate hard masks 14 and first mask patterns 15 are formed over the metal layer 13. The gate hard masks 14 are formed to protect subsequent gate electrodes and to function as an etch barrier when forming the gate patterns. The gate hard masks 14 are formed by forming a hard mask layer over the metal layer 13, forming the first mask patterns 15 defining regions predetermined for the gate patterns over the hard mask layer, and performing an etch process using the first mask patterns 15 as an etch barrier. The gate hard masks 14 include an insulating material. For instance, the gate hard masks 14 may include a nitride-based layer.

Figure 2B:
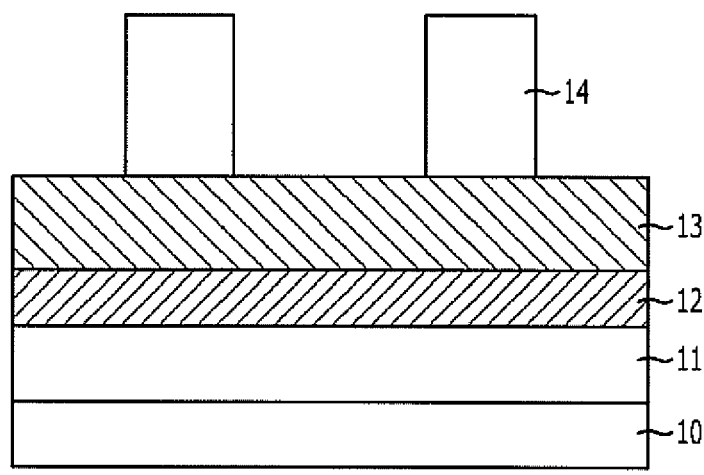

Referring to FIG. 2B, the first mask patterns 15 are removed. If the first mask patterns 15 include photoresist or amorphous carbon, the first mask patterns 15 are removed using a dry etch process. The dry etch process may include performing an oxygen removal process.

Figure 2C:
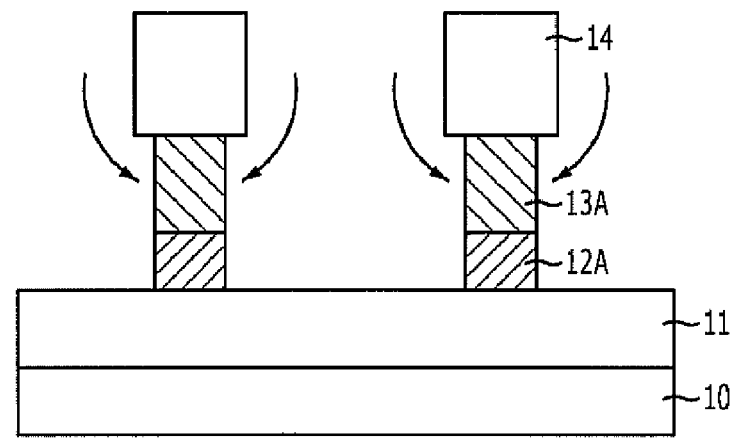

Referring to FIG. 2C, the metal layer 13 (FIG. 2A) and the barrier metal layer 12 (FIG. 2A) are etched to form barrier metal electrodes 12A and metal gate electrodes 13A using the gate hard masks 14 as an etch barrier. A portion of the gate hard masks 14 may be lost during the etching. For convenience of description, the gate hard masks before being etched and the gate hard masks after being etched are referred to with a same reference number 14.

A stack structure of multiple thin layers (for example, a stack structure including a tungsten layer, a tungsten silicide layer, a tungsten nitride layer, and a titanium layer) is etched to form the barrier metal electrodes 12A and the metal gate electrodes 13A. While etching the thin layers, a slope profile may be formed due to an etch rate difference between the layers having different characteristics.

Therefore, etch conditions are altered in this embodiment of the present invention to minimize the etch difference between the thin layers. In particular, the thin layers are etched in a manner to decrease the slope profile of the barrier metal electrodes 12A and the metal gate electrodes 13A, and to form the barrier metal electrodes 12A and the metal gate electrodes 13A to have a line width smaller than that of the gate hard masks 14.

In detail, a main etching process and an over etching process are performed on the metal layer 13 (FIG. 2A) and the barrier metal layer 12 (FIG. 2A). For instance, the main etching process may include performing an isotropic etching process. By performing the isotropic etching process, sidewalls of the metal layer 13 (FIG. 2A) and the barrier metal layer 12 (FIG. 2A) may be etched to form a vertical profile and the barrier metal electrodes 12A and the metal gate electrodes 13A having a smaller line width than that of the gate hard masks 14 may be formed. For example, the isotropic etching process may be performed in a magnetically enhanced reactive ion beam etching (MERIE) apparatus using a plasma etch. The isotopic etching process comprises using a gas including nitrogen trifluoride ($NF_3$), chlorine ($Cl_2$), Oxygen ($O_2$), nitrogen ($N_2$) and helium (He).

At this time, a magnetic field flux is maintained at approximately 0 G while forming plasma so that the probability of second electron ionization is reduced. Thus, the rate of breaking an insulating material's bonding is reduced, thereby inducing isotropic etching. As a result, barrier metal electrodes 12A and metal gate electrodes 13A having smaller line widths than that of the gate hard masks 14 may be formed.

Furthermore, an etch characteristic may be improved by increasing a temperature of a bottom electrode in a chamber at substantially the same time. The temperature may be increased by at least 10° C. to the temperature used in a conventional etching process. For example, the temperature may be maintained at range from approximately 75° C. to approximately 90° C. As the temperature increases, the slope profile of the metal gate electrodes 13A and the barrier metal electrodes 12A may be decreased and an under cut may be generated, causing the metal gate electrodes 13A and the barrier metal electrodes 12A to be formed with the vertical profile.

Moreover, the isotropic etch characteristic is enhanced by reducing a bias power lower than that of a conventional etching process and by increasing a micro wave power and pressure greater than those of a conventional etching process. For example, the bias power is reduced from 70 W used in the conventional etching process to approximately 40 W and the micro wave power is increased from 600 W used in the conventional etching process to 800 W. Furthermore, the pressure is increased to range from approximately 2.5 mTorr to approximately 4 mTorr. The isotropic etch characteristic is enhanced by reducing a bias power to that used in a conventional process and by increasing a micro wave power and pressure to those of used in a conventional process. Especially, increasing the pressure reduces a mean free path of an etch gas and increases a scattering effect of particles. Consequently, the isotropic etch characteristic is further strengthened. Thus, the under cut of the metal gate electrodes 13A and the barrier metal electrodes 12A may be generated.

By performing the isotropic etching process, the metal gate electrodes 13A and the barrier metal electrodes 12A are etched to have a line width smaller than that of the gate hard masks 14, the slope profile is improved and the vertical profile is formed. As a result, a bottom line width of the gate patterns may not increase even when the polysilicon layer 11 is etched.

Figure 2D:
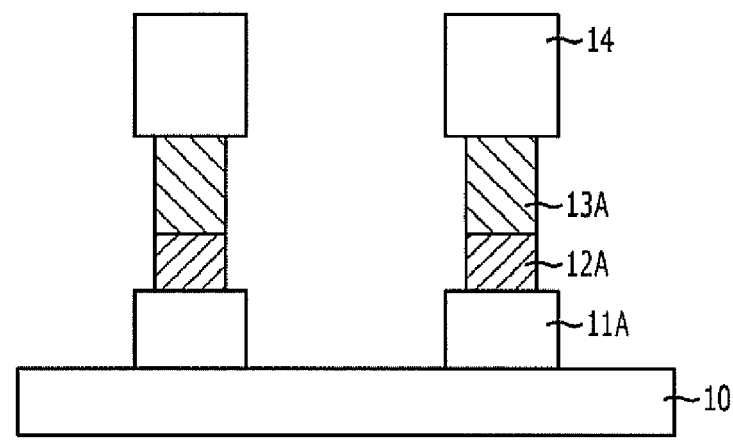

Referring to FIG. 2D, the polysilicon layer 11 (FIG. 2B) is etched. Thus, gate patterns including stack structures of polysilicon electrodes 11A, the barrier metal electrodes 12A, the metal gate electrodes 13A, and the gate hard masks 14 are formed.

The polysilicon layer 11 (FIG. 2B) is etched using an anisotropic etching process. For instance, the polysilicon layer 11 may be etched using a gas including nitrogen trifluoride ($NF_3$), sulfur hexafluoride ($SF_6$), chlorine ($Cl_2$), nitrogen ($N_2$) and helium (He). Especially, it is preferable to increase the flow ratio of $NF_3$ and $SF_6$ to that of a conventional process. For example, the flow ration is increased to 20 to 30 sscm greater than that of the conventional etching process. As a result, the etch rate difference between the thin layers may be reduced. In particular, using a fluorine-based gas improves the slope profile of tungsten silicide where a slope profile is often highly likely to occur. Thus, the vertical profile is maintained.

As above, the barrier metal electrodes 12A and the metal gate electrodes 13A are formed using the isotropic etching process to obtain the vertical profile and the line width smaller than that of the gate hard masks 14. Consequently, the polysilicon layer 11 (FIG. 2B) may also be etched to have a vertical profile, preventing a line width at the bottom of the gate patterns from increasing.

Then, a trimming is further performed. The trimming is a further step to enhance the profile of the polysilicon electrode 11A. The trimming is performed at the same environment of the etching of the polysilicon electrode 11A (FIG. 2B) without using a power and fluorine gas i.e. $NF_3$ and $SF_6$. In other words, the trimming is performed using a gas including $Cl_2$, $N_2$ and He. The slope of the sidewall of the polysilicon electrode 11A is further enhanced by using an inert gas of He and $N_2$ in trimming.

Figure 2E:
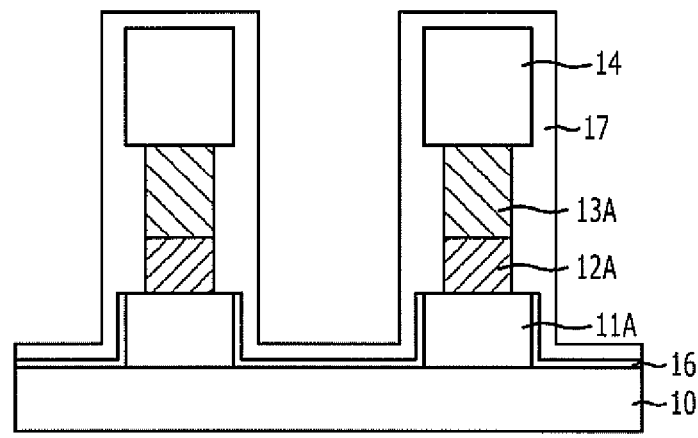

Referring to FIG. 2E, a gate reoxidation process is performed on the substrate structure to form reoxidation layers 16 over sidewalls of the polysilicon electrodes 11A and portions of the substrate 10. The gate reoxidation process is performed to smooth edges of the gate patterns so that a gate induced drain leakage (GIDL) and deterioration by hot electrons may be prevented, and so layers damaged during the etching processes for forming the gate patterns may be compensated.

A gate spacer 17 is formed over the surface profile of the substrate structure. The gate spacer 17 is formed to protect sidewalls of the gate patterns and provide insulation between the gate patterns and a subsequent landing plug contact. The gate spacer 17 is formed using an insulating material. The gate spacer 17 is formed using a material having a selectivity with respect to a subsequent insulation layer because the gate spacer 17 functions as an etch stop layer when forming the subsequent landing plug contact. For instance, the gate spacer 17 is formed using a nitride-based layer.

Figure 2F:
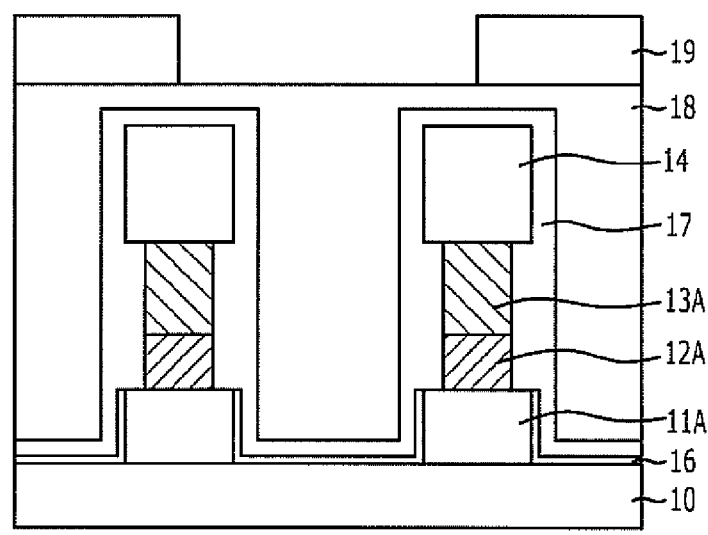

Referring to FIG. 2F, an insulation layer 18 is formed over the gate spacer 17, buried between the gate patterns. The insulation layer 18 is formed to provide insulation between the gate patterns, and also inter-layer insulation between the gate patterns and bit lines to be formed over the gate patterns. For instance, the insulation layer 18 may be formed using an oxide-based layer. The oxide-based layer may include borophosphosilicate glass (BPSG) having a sufficient level of gap-fill characteristic to fill narrow spaces between the gate patterns.

Second mask patterns 19 are formed over the insulation layer 18. The second mask patterns 19 may be formed by forming a photoresist layer over the insulation layer 18 and patterning the photoresist layer using a photo-exposure and developing process. A hard mask layer may be additionally formed below the photoresist layer to secure an etch margin.

Figure 2G:
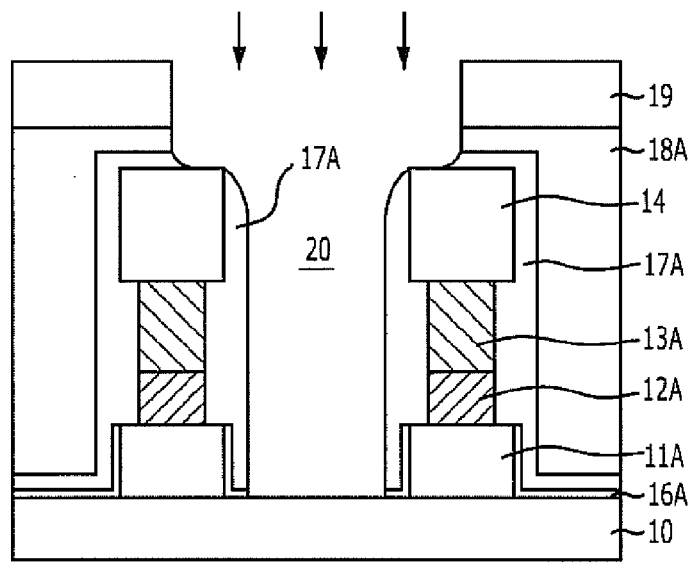

Referring to FIG. 2G, the insulation layer 18, the gate spacer 17, and the reoxidation layers 16 are etched using the second mask patterns 19 to form insulation patterns 18A, gate spacer patterns 17A, and reoxidation patterns 16A. A contact hole 20 exposing a portion of the substrate 10 is formed by forming the insulation patterns 18A, the gate spacer patterns 17A, and the reoxidation patterns 16A. For instance, the insulation patterns 18A may be formed using a self-aligned contact etch process. The self-aligned contact etch process includes performing an etch process using an etch selectivity between a nitride layer and an oxide layer to decrease difficulties in patterning regions predetermined for contact holes. The difficulties are due to the limiting resolution caused by narrowed spaces between gate patterns as semiconductor devices become highly integrated.

The self-aligned contact etch process is performed using an oxide etch gas. For instance, the self-aligned contact etch process may be performed using a gas having a high selectivity with respect to nitride, such as, a gas including fluoroform ($CHF_3$) and octafluorocyclobutane ($C_4F_8$) as a main etch gas.

Because the gate patterns, in particular, the barrier metal electrodes 12A and the metal gate electrodes 13A, are formed with the vertical profile and, at substantially the same time, have the line width smaller than that of the gate hard masks 14, a loss of the gate spacer 17 (FIG. 2F) may be reduced. Thus, exposure of the metal gate electrodes 13A caused by lost portions of the gate spacer 17 may be prevented.

Figure 2H:
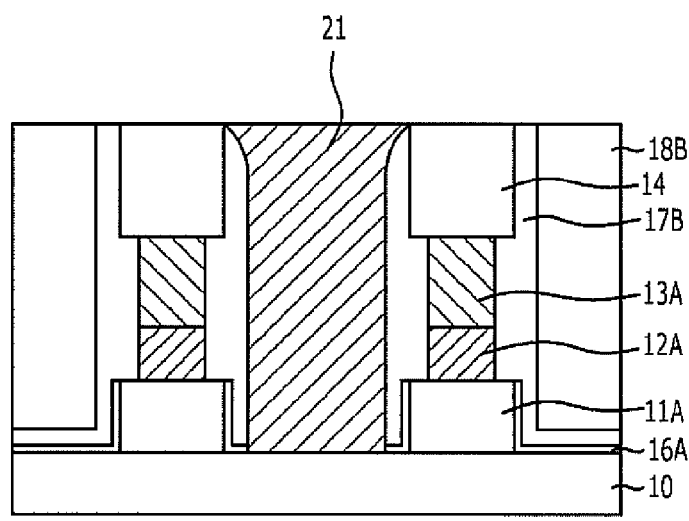

Referring to FIG. 2H, a conductive material is buried over the contact hole 20 to form a landing plug contact 21. In detail, the conductive material is buried over the contact hole 20 and a planarization process is performed until upper portions of the gate hard masks 14 are exposed. Consequently, the landing plug contact 21 is formed. While forming the landing plug contact 21, the second mask patterns 19, and portions of the insulation patterns 18A and gate spacer patterns 17A are removed to expose the upper portions of the gate hard masks 14. As a result, remaining insulation patterns 18B and remaining gate spacer patterns 17B are formed. The planarization process may include performing a chemical mechanical polishing (CMP) process.

Forming the gate patterns with a vertical profile using an isotropic etch process reduces gate spacer loss and thus prevents exposure of the metal gate electrodes. Consequently, a bridge between the landing plug contact and the metal gate electrodes may be prevented, reducing an instance of a self-aligned contact failure.

Figure 3:
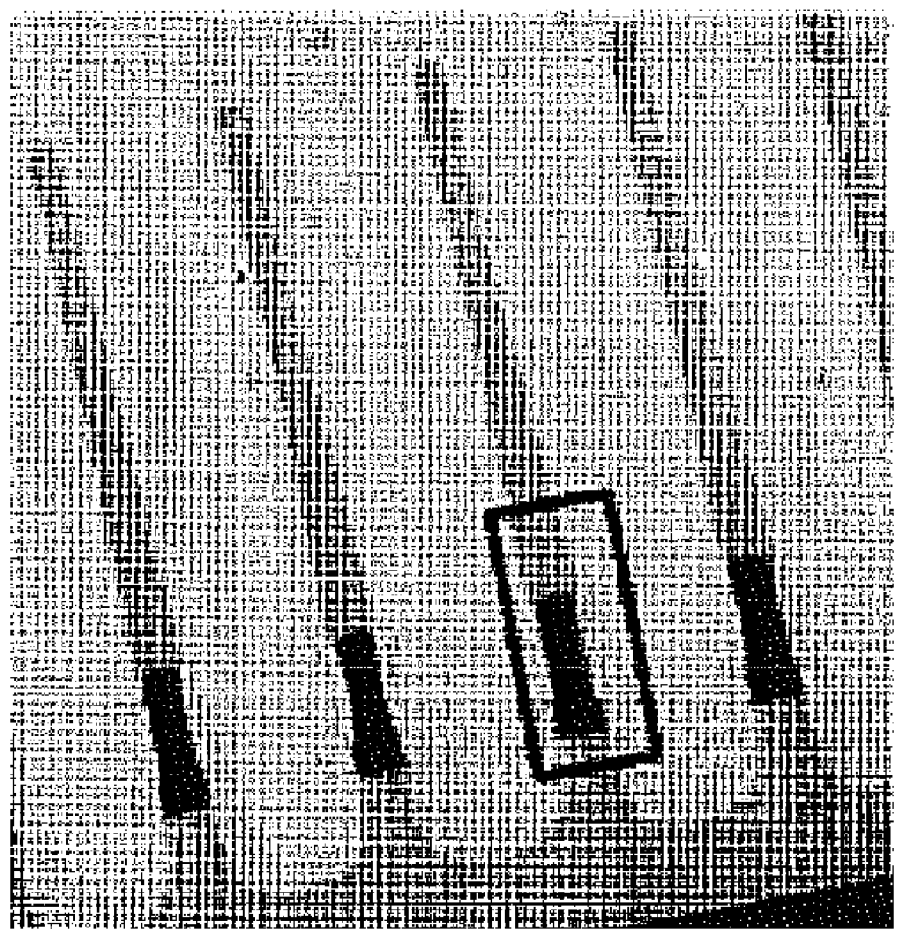
FIG. 3 illustrates a micrographic view showing gate patterns in a semiconductor device in accordance with the embodiment of the present invention.

FIG. 3 illustrates a micrographic view showing gate patterns in a semiconductor device in accordance with the embodiment of the present invention.

Referring to FIG. 3, metal gate electrodes in the gate patterns are formed to have a vertical profile and a line width smaller than that of gate hard masks due to an under cut.

The method for fabricating a semiconductor device in accordance with the embodiment of the present invention may reduce gate spacer loss by forming gate patterns with a vertical profile using an isotropic etch process. Therefore, exposure of metal gate electrodes may be prevented and thus a bridge between a landing plug contact and the metal gate electrodes may be less likely to occur. Consequently, an instance of failure of a self-aligned contact may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a polysilicon layer, a barrier metal layer, and a conductive layer over a substrate, wherein the conductive layer is formed for forming electrodes;

forming gate hard masks over the conductive layer;

etching the conductive layer and the barrier metal layer using the gate hard masks to form barrier metal electrodes and metal gate electrodes having a line width smaller than that of the gate hard masks;

etching the polysilicon layer to form gate patterns, each gate pattern including a stack structure of a polysilicon electrode, the barrier metal electrode, the metal gate electrode, and the gate hard mask;

forming a gate spacer over the surface profile of the substrate structure;

forming an insulation layer over the gate spacer, buried between the gate patterns;

etching the insulation layer to form a contact hole between the gate patterns; and burying a conductive material over the contact hole to form a landing plug contact.

2. The method of claim 1, wherein the conductive layer comprises a tungsten layer and the barrier metal layer comprises a stack structure of a titanium layer, a tungsten nitride layer, and a tungsten silicide layer.

3. The method of claim 2, wherein the etching of the conductive layer and the barrier metal layer to form the barrier metal electrodes and the metal gate electrodes comprises performing a main etching process and performing the main etching process using an isotropic etch process.

4. The method of claim 3, wherein the isotropic etch process comprises performing a plasma etch in a magnetically enhanced reactive ion beam etching (MERIE) apparatus.

5. The method of claim 4, wherein the isotropic etch process comprises maintaining a magnetic field flux of approximately 0 G while forming plasma.

6. The method of claim 3, wherein the isotropic etch process comprises maintaining a temperature of a bottom electrode at approximately 90° C., applying a bias power at approximately 40 W, applying a micro wave power at approximately 800 W and maintaining a pressure at approximately 4 mTorr.

7. The method of claim 3, wherein the isotropic etch process comprises using a gas including nitrogen trifluoride ($NF_3$), chlorine ($Cl_2$), Oxygen ($O_2$), nitrogen ($N_2$) and helium (He).

8. The method of claim 1, wherein the etching of the polysilicon layer is performed using an anisotropic etch process.

9. The method of claim 8, wherein the anisotropic etching process comprises using a gas including nitrogen trifluoride ($NF_3$), sulfur hexafluoride ($SF_6$), chlorine ($Cl_2$), nitrogen ($N_2$) and helium (He).

10. The method of claim 1, the method further comprises a performing trimming after etching of the polysilicon.

11. The method of claim 10, the trimming is performed using a gas including $Cl_2$, $N_2$ and He.

12. The method of claim 1, wherein the gate spacer comprises a nitride-based layer.

13. The method of claim 1, wherein the insulation layer comprises an oxide-based layer.

14. The method of claim 12, wherein the etching of the insulation layer to form the contact hole comprises performing a self-aligned contact etch process.

15. The method of claim 12, wherein the etching of the insulation layer to form the contact hole comprises performing a self-aligned contact etch process.

* * * * *